United States Patent
Fujino et al.

(10) Patent No.: US 10,026,635 B2
(45) Date of Patent: Jul. 17, 2018

(54) PACKAGING APPARATUS AND PACKAGING DEVICE

(71) Applicant: BOE TECHNOLOGY GROUP CO., LTD., Beijing (CN)

(72) Inventors: Seiji Fujino, Beijing (CN); Guodong Huang, Beijing (CN); Xiaolei Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 288 days.

(21) Appl. No.: 14/891,880

(22) PCT Filed: Oct. 30, 2014

(86) PCT No.: PCT/CN2014/089893
§ 371 (c)(1),
(2) Date: Nov. 17, 2015

(87) PCT Pub. No.: WO2015/180408
PCT Pub. Date: Dec. 3, 2015

(65) Prior Publication Data
US 2016/0181136 A1 Jun. 23, 2016

(30) Foreign Application Priority Data
May 28, 2014 (CN) .......................... 2014 1 0230685

(51) Int. Cl.
*H01T 23/00* (2006.01)
*H01L 21/683* (2006.01)
(Continued)

(52) U.S. Cl.
CPC .... *H01L 21/6833* (2013.01); *H01L 21/67121* (2013.01); *H01L 21/683* (2013.01);
(Continued)

(58) Field of Classification Search
USPC ................................................ 361/234, 230
See application file for complete search history.

(56) References Cited

U.S. PATENT DOCUMENTS

| | | | | |
|---|---|---|---|---|
| 5,764,471 A | * | 6/1998 | Burkhart | H01L 21/6833 361/234 |
| 7,623,334 B2 | * | 11/2009 | Mizuno | H01L 21/6833 361/230 |
| 2011/0164343 A1 | * | 7/2011 | Sogard | G03F 7/70708 361/234 |

FOREIGN PATENT DOCUMENTS

| | | |
|---|---|---|
| CN | 101069453 | 11/2007 |
| CN | 101874298 | 10/2010 |

(Continued)

OTHER PUBLICATIONS

Written Opinion of the International Searching Authority for the corresponding PCT Application PCT/CN2014/089893 (5 pages); dated Feb. 27, 2015.

(Continued)

*Primary Examiner* — Danny Nguyen
(74) *Attorney, Agent, or Firm* — Harness, Dickey & Pierce, P.L.C.

(57) ABSTRACT

The present invention discloses a packaging apparatus and a packaging device. The packaging apparatus comprises a mask plate and a control circuit that is electrically connected to the mask plate and is used to control the mask plate such that the mask plate electrostatically adsorbs a first substrate or release the first substrate. In the technical solutions of the present invention, the mask plate is controlled by the control circuit such that the mask plate electrostatically adsorbs or releases the first substrate without the need to use the alignment mechanism of mechanical fixing type to fix the first substrate. By completely adsorbing the first substrate by the mask plate in a way of electrostatic adsorption, the (Continued)

deformation of the first substrate and the generation of bubbles between the first substrate and the second substrate are avoided, the alignment precision is improved, and the slip-off of the first substrate from the mask plate during the process of pressing is avoided.

16 Claims, 6 Drawing Sheets

(51) Int. Cl.
*H01L 51/56* (2006.01)
*H01L 21/67* (2006.01)
*H01L 27/32* (2006.01)
*H01L 51/52* (2006.01)

(52) U.S. Cl.
CPC ........ *H01L 27/3244* (2013.01); *H01L 51/524* (2013.01); *H01L 51/56* (2013.01); *H01L 2227/323* (2013.01)

(56) References Cited

FOREIGN PATENT DOCUMENTS

| | | |
|---|---|---|
| CN | 104051495 | 9/2014 |
| JP | 4241571 | 3/2009 |
| WO | 2013/047648 | 4/2013 |

OTHER PUBLICATIONS

Second Office Action from corresponding Chinese Application No. 201410230685.9, dated Sep. 29, 2016, 4 pages.

* cited by examiner

PACKAGING APPARATUS AND PACKAGING DEVICE

TECHNICAL FIELD

The present invention relates to the field of display technology, and particularly relates to a packaging apparatus and a packaging device.

BACKGROUND

Organic light emitting diode (OLED for short) display screen has a characteristic of self-illumination, and uses a very thin coating of organic materials, which will emit light when energized, and a glass substrate. Furthermore, the OLED display screen has a large viewing angle and can significantly reduce the power consumption. Therefore the OLED display technology has found an increasingly wide application with the development of the display technology. For example, as an important application of the OLED display technology, an Active Matrix Organic Light Emitting Diode (AMOLED for short) display screen is widely used because of its features such as faster response speed, higher contrast, larger viewing angle and the like.

During the process of fabricating an OLED display screen, it is needed to use a packaging device to package a first substrate and a second substrate that have been prepared so as to form a display screen. The packaging device is an all-in-one packaging device with UV (ultra-violet) irradiation. The packaging device may comprise an upper quartz platform on which the second substrate may be arranged and a lower quartz platform on which a mask plate may be arranged, wherein the first substrate is arranged on the mask plate, and wherein the first substrate and the second substrate are packaged so as to form the display screen.

There are following technical problems in the prior art:

1) During the packaging process, it is necessary to align the first substrate by an alignment mechanism of mechanical fixing type and keep the first substrate being fixed on the mask plate after the alignment. However, the first substrate is easy to be deformed due to the stress produced by the aligning mechanism of mechanical fixing type which has a complicated structure.

2) It is necessary to align the first substrate on the mask plate by an alignment way of mechanical fixing type. However, the alignment mechanism of mechanical fixing type would interfere with the upper quartz platform in the subsequent process of pressing the first substrate and the second substrate together, resulting in the generation of bubbles between the first substrate and the second substrate and low alignment precision that would be ±7 μm generally.

3) If the alignment mechanism of mechanical fixing type is drawn back in the process of pressing, it would not interfere with the upper quartz platform. However, the first substrate is likely to slip off from the mask plate during the process of drawing back the alignment mechanism of mechanical fixing type.

SUMMARY OF THE INVENTION

The embodiments of the present invention provide a packaging apparatus and a packaging device. The packaging apparatus can avoid the deformation of the first substrate during the packaging process, avoid the generation of bubbles between the first substrate and the second substrate, improve the alignment precision, and avoid the slip-off of the first substrate from the mask plate during the process of pressing.

The embodiments of the present invention provide a packaging apparatus, wherein the packaging apparatus comprises: a mask plate; and a control circuit that is electrically connected to the mask plate and is used to control the mask plate such that the mask plate electrostatically adsorbs a first substrate or releases the first substrate.

Optionally, the mask plate comprises a base substrate, a pattern layer on the base substrate and an insulation layer on the pattern layer, the pattern layer comprises pattern structures and opening structures between the pattern structures, and the pattern structures are electrically connected to the control circuit.

Optionally, the mask plate further comprises a first connection structure on a lateral side of the base substrate and at least one second connection structure in each of the opening structures, wherein the first connection structure is used to electrically connect the pattern structures to the control circuit, and the second connection structure is used to electrically connecting a pattern structure outside the opening structures to a pattern structure inside the opening structures.

Optionally, a length of the second connection structure is larger than or equal to a width of the opening structures.

Optionally, a positive voltage is applied to the mask plate through the control circuit such that the mask plate adsorbs the first substrate, and then a negative voltage is applied to the mask plate or positive charges are released from the mask plate through the control circuit such that the mask plate releases the first substrate; or alternatively, a negative voltage is applied to the mask plate through the control circuit such that the mask plate adsorbs the first substrate, and then a positive voltage is applied to the mask plate or negative charges are released from the mask plate through the control circuit such that the mask plate releases the first substrate.

Optionally, the control circuit comprises a first power source and a second power source that are connected in parallel, wherein the first power source is used to apply the positive voltage to the mask plate and the second power source is used to apply the negative voltage to the mask plate.

Optionally, a positive electrode of the first power source and a negative electrode of the second power source are both connected to the mask plate, a negative electrode of the first power source is grounded via a first switch, and a positive electrode of the second power source is grounded via a second switch, the first power source is used to apply the positive voltage to the mask plate when the first switch is switched on and the second switch is switched off, and the second power source is used to apply the negative voltage to the mask plate when the second switch is switched on and the first switch is switched off.

Optionally, the control circuit comprises a third power source and a releasing branch circuit that are connected in parallel, wherein: the third power source is used to apply the positive voltage to the mask plate and the releasing branch circuit is used to release positive charges from the mask plate; or alternatively, the third power source is used to apply the negative voltage to the mask plate and the releasing branch circuit is used to release negative charges from the mask plate.

Optionally, in the case that the third power source is used to apply the positive voltage to the mask plate and the releasing branch circuit is used to release the positive charges from the mask plate, a positive electrode of the third power source and one terminal of the releasing branch circuit are both connected to the mask plate, a negative electrode of the third power source is grounded via a third switch, and the other terminal of the releasing branch circuit is grounded via a fourth switch, the third power source is used to apply the positive voltage to the mask plate when the third switch is switched on and the fourth switch is switched off, and the releasing branch circuit is used to release the positive charges from the mask plate when the fourth switch is switched on and the third switch is switched off.

Optionally, in the case that the third power source is used to apply the negative voltage to the mask plate and the releasing branch circuit is used to release the negative charges from the mask plate, a negative electrode of the third power source and one terminal of the releasing branch circuit are both connected to the mask plate, a positive electrode of the third power source is grounded via a third switch, and the other terminal of the releasing branch circuit is grounded via a fourth switch, the third power source is used to apply the negative voltage to the mask plate when the third switch is switched on and the fourth switch is switched off, and the releasing branch circuit is used to release the negative charges from the mask plate when the fourth switch is switched on and the third switch is switched off.

The embodiments of the present invention also provide a packaging device comprising an upper platform, a lower platform and the packaging apparatus described hereinabove, wherein: the mask plate is arranged on the lower platform, and the upper platform is used to arrange the second substrate; or alternatively, the mask plate is arranged on the upper platform, and the lower platform is used to arrange the second substrate.

In the technical solutions of the packaging apparatus and the packaging device provided in the present invention, the mask plate is controlled by the control circuit such that the mask plate electrostatically adsorbs or releases the first substrate without the need to use the alignment mechanism of mechanical fixing type to fix the first substrate. By completely adsorbing the first substrate by the mask plate in a way of electrostatic adsorption, the deformation of the first substrate and the generation of bubbles between the first substrate and the second substrate are avoided, the alignment precision is improved, and the slip-off of the first substrate from the mask plate during the process of pressing is avoided.

DETAILED DESCRIPTION OF THE INVENTION

In order to make those skilled in the art better understand the technical solutions of the present invention, hereinafter the packaging apparatus and the packaging device provided in the present invention will be described in detail in conjunction with accompany drawings.

Figure 1:
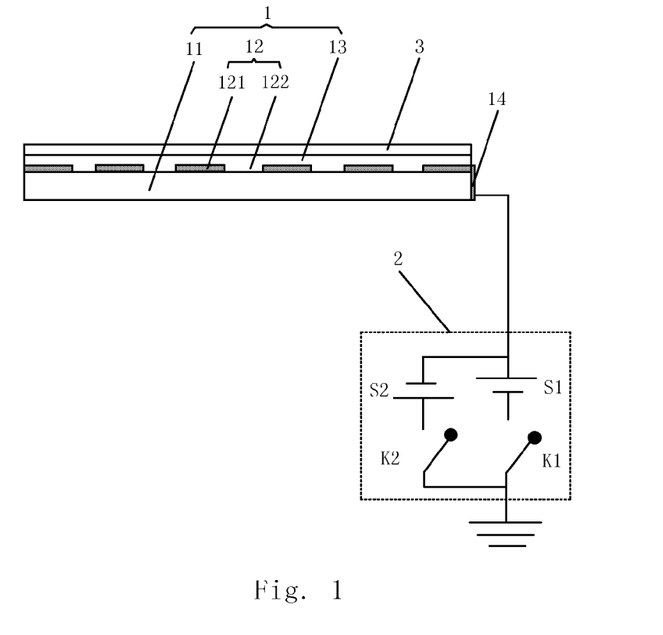
FIG. 1 is a schematic diagram illustrating the structure of a packaging apparatus provided in a first embodiment of the present invention.

FIG. 1 is a schematic diagram illustrating the structure of a packaging apparatus provided in a first embodiment of the present invention. As illustrated in FIG. 1, the packaging apparatus comprises a mask plate 1 and a control circuit 2, which is electrically connected to the mask plate 1 and is used to control the mask plate 1 such that the mask plate 1 electrostatically adsorbs or releases a first substrate 3.

Figure 2:
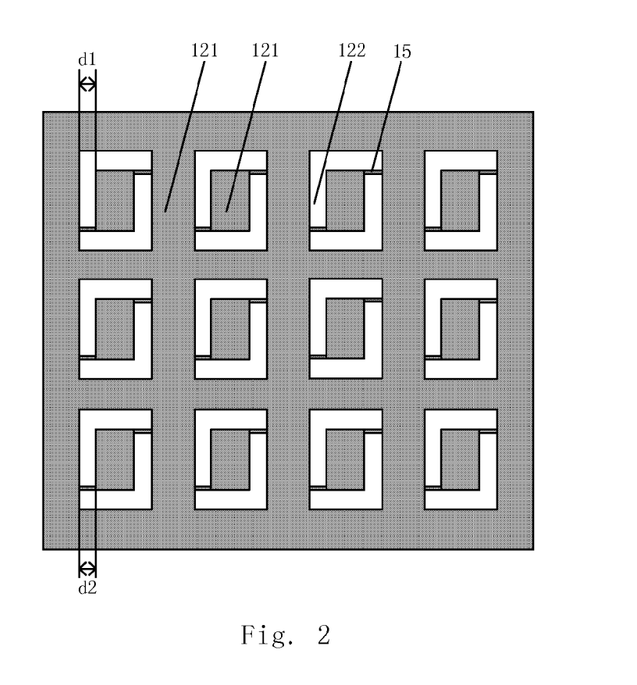
FIG. 2 is a schematic plan view illustrating the mask plate in FIG. 1.

FIG. 2 is a schematic plan view illustrating the mask plate in FIG. 1. As shown in FIGS. 1 and 2 in conjunction, the mask plate 1 comprises a base substrate 11, a pattern layer 12 on the base substrate 11 and an insulation layer 13 on the pattern layer 12. The patter layer 12 comprises pattern structures 121 and opening structures 122 between the pattern structures 121, wherein the pattern structures 121 are electrically connected to the control circuit 2. When curing the frame-sealing adhesive by UV light, the pattern structures 121 are used to block the LTV light, and the opening structures 122 are arranged in correspondence to the frame-sealing adhesive so that the UV light irradiates the frame-sealing adhesive through the opening structures 122 to cure the frame-sealing adhesive. Preferably, the opening structures have an annular shape. Preferably, the material of the pattern structures 121 is a metal such as Cr or Al. Preferably, the base substrate 11 is quartz glass. Preferably, the material of the insulation layer 13 comprises $Al_2O_3$, $SiO_2$ or SiON.

The mask plate 1 further comprises a first connection structure 14 on a lateral side of the base substrate 11 (as shown in FIG. 1) and at least one second connection structure 15 in each of the opening structures 122 (as shown in FIG. 2). The first connection structure 14 is used for electrically connecting a pattern structure 121 to the control circuit 2. The second connection structure 15 is used for electrically connecting a pattern structure 121 outside the opening structures 122 to a pattern structure 121 inside the opening structures 122, and thereby the electrical connection of all pattern structures 121 on the whole base substrate 11 can be achieved through the second connection structure 15. The number of the second connection structure 15 in each opening structure 122 may be one or more. In the present embodiment, it is preferable that the number of the second connection structure 15 in each opening structure 122 is two, and the two second connection structures 15 are arranged diagonally. By using two connection structures 15 in each opening structure 122, not only the characteristic of electrical connection of the pattern structures 121 but also the patterning simplicity of the pattern layer can be ensured. The material of the second connection structure 15 is a metal, and preferably, the second connection structure 15 and the pattern structures 121 are formed of the same material synchronously. For example, the material of both the second connection structure 15 and the pattern structures 121 is Cr or Al. Preferably, the second connection structure 15 in the opening structures 122 has a linear shape. Since the second connection structure 15 of a linear shape can occupy less area of the opening structures 122, the light transmittance of the opening structures 122 can be ensured effectively.

In the present embodiment, a length d2 of the second connection structure 15 may be larger than or equal to a width dl of the opening structures 122, in order to ensure that the pattern structure 121 outside an opening structure 122 can be electrically connected to the pattern structure 121 inside the opening structure 122 effectively. In practical applications, the length of the second connection structure 15 and the width of the opening structure 122 may be set as required by the products.

The control circuit 2 comprises a first power source S1 and a second power source S2 that are connected in parallel. Preferably, a positive electrode of the first power source S1 and a negative electrode of the second power source S2 are both connected to the mask plate 1, a negative electrode of the first power source S1 is grounded via a first switch K1, and a positive electrode of the second power source S2 is grounded via a second switch K2. Specifically, the positive electrode of the first power source S1 and the negative electrode of the second power source S2 are both connected to the first connection structure 14.

Figure 3A:
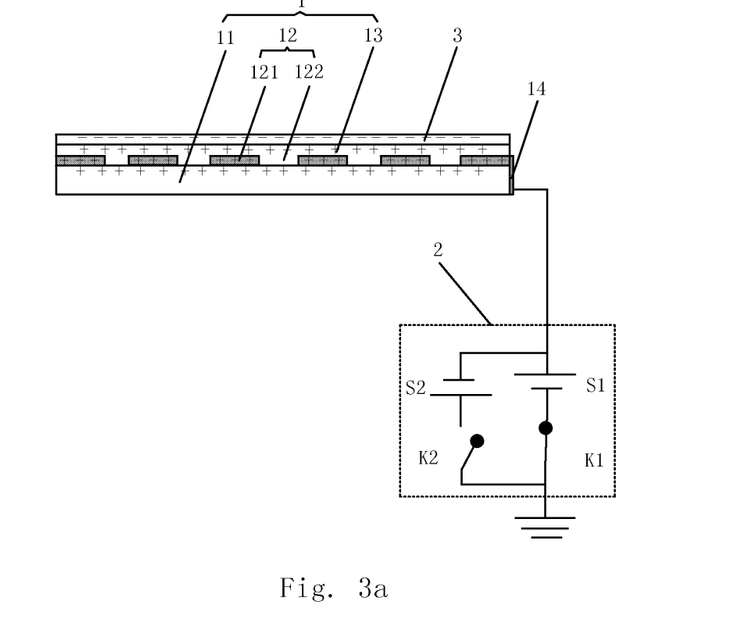
FIG. 3a is a schematic diagram illustrating an operation state of the control circuit in FIG. 1.

FIG. 3a is a schematic diagram illustrating an operation state of the control circuit in FIG. 1. As shown in FIG. 3a, when it is needed to fix the first substrate 3 on the mask plate 1, the first power source S1 is used to apply positive voltage to the mask plate 1 so that the mask plate 1 electrostatically adsorbs the first substrate 3. Specifically, the first power source S1 is used to apply positive voltage to the mask plate 1 when the first switch K1 is switched on and the second switch K2 is switched off so that the mask plate 1 electrostatically adsorbs the first substrate 3. At this moment, the first power source S1 applies positive voltage to the pattern structures 121 via the first connection structure 14 such that the whole mask plate 1 is positively charged and the first substrate 3 is negatively charged through electrostatic induction. The positively charged mask plate 1 and the negatively charged first substrate 3 attract each other, and therefore the mask plate 1 can electrostatically adsorb the first substrate 3. Preferably, the positive voltage applied by the first power source S1 is larger than 0 kV and less than or equal to 2.0 kV.

Figure 3B:
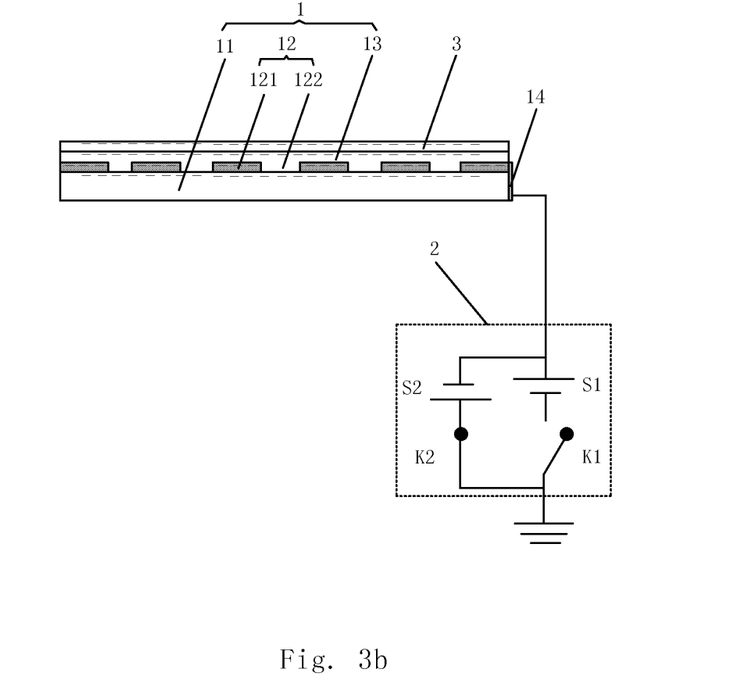
FIG. 3b is a schematic diagram illustrating another operation state of the control circuit in FIG. 1.

FIG. 3b is a schematic diagram illustrating another operation state of the control circuit in FIG. 1. As shown in FIG. 3b, when it is needed to release the first substrate 3 fixed on the mask plate 1, the second power source S2 is used to apply negative voltage to the mask plate 1 so that the mask plate 1 releases the first substrate 3. Specifically, the second power source S2 is used to apply negative voltage to the mask plate 1 when the second switch K2 is switched on and the first switch K1 is switched off so that the mask plate 1 releases the first substrate 3. At this moment, the second power source S2 applies negative voltage to the pattern structures 121 via the first connection structure 14 such that the mask plate 1 that is previously positively charged is now negatively charged. The negatively charged mask plate 1 and the negatively charged first substrate 3 reject each other such that the mask plate 1 releases the first substrate 3. Preferably, the negative voltage applied by the second power source S2 is larger than or equal to −2.0 kV and less than 0 kV. When the mask plate 1 and the first substrate 3 are separated, the static electricity is generally released. In order to avoid the affection of the residual static electricity, the mask plate 1 and the first substrate 3 may be respectively connected to the ground (GND) to eliminate static electricity thoroughly on the premise that the first power source S1 and the second power source S2 are both disconnected, thereby preventing the occurrence of static electricity and ensuring security.

In practical applications, optionally, when it is needed to fix the first substrate 3 on the mask plate 1, the second power source S2 may be used to apply negative voltage to the mask plate 1 so that the mask plate 1 electrostatically adsorbs the first substrate 3. Specifically, the second power source S2 is used to apply negative voltage to the mask plate 1 when the second switch K2 is switched on and the first switch K1 is switched off so that the mask plate 1 electrostatically adsorbs the first substrate 3. When it is needed to release the first substrate 3 fixed on the mask plate 1, the first power source S1 may be used to apply positive voltage to the mask plate 1 so that the mask plate 1 releases the first substrate 3. Specifically, the first power source S1 is used to apply positive voltage to the mask plate 1 when the first switch K1 is switched on and the second switch K2 is switched off so that the mask plate 1 releases the first substrate 3. When the mask plate 1 and the first substrate 3 are separated, the static electricity is released, thereby preventing the occurrence of static electricity and ensuring security. The schematic diagram of the operation state of the control circuit in this situation is not drawn specifically.

In the technical solution of the packaging apparatus provided in the present embodiment, the control circuit controls the mask plate such that the mask plate electrostatically adsorbs or releases the first substrate without the need to use the alignment mechanism of mechanical fixing type to fix the first substrate. By completely adsorbing the first substrate by the mask plate in a way of electrostatic adsorption, the deformation of the first substrate and the generation of bubbles between the first substrate and the second substrate are avoided, the alignment precision is improved, and the slip-off of the first substrate from the mask plate during the process of pressing is avoided.

Figure 4:
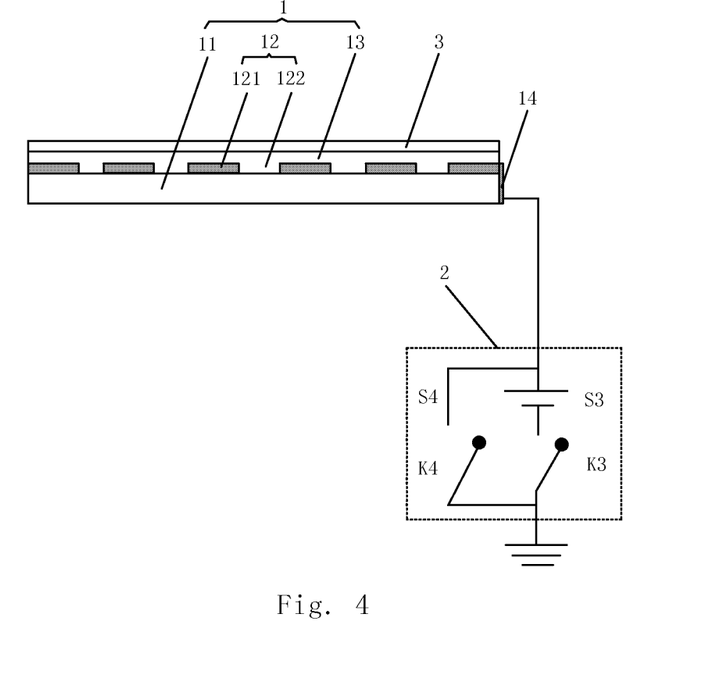
FIG. 4 is a schematic diagram illustrating the structure of a packaging apparatus provided in a second embodiment of the present invention.

FIG. 4 is a schematic diagram illustrating the structure of a packaging apparatus provided in a second embodiment of the present invention. As shown in FIG. 4, the packaging apparatus is different from the packaging apparatus in the first embodiment in that the control circuit 2 comprises a third power source S3 and a releasing branch circuit S4 that are connected in parallel. Preferably, a positive electrode of the third power source S3 and one terminal of the releasing branch circuit S4 are both connected to the mask plate 1, a negative electrode of the third power source is grounded via a third switch K3, and the other terminal of the releasing branch circuit S4 is grounded via a fourth switch K4.

Figure 5A:
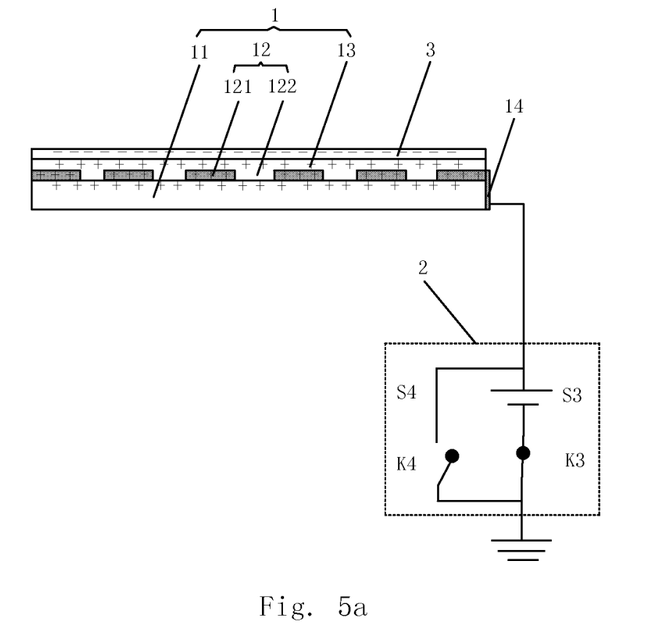
FIG. 5a is a schematic diagram illustrating an operation state of the control circuit in FIG. 4.

FIG. 5a is a schematic diagram illustrating an operation state of the control circuit in FIG. 4. As shown in FIG. 5a, when it is needed to fix the first substrate 3 on the mask plate 1, the third power source S3 is used to apply positive voltage to the mask plate 1 so that the mask plate 1 electrostatically adsorbs the first substrate 3. Specifically, the third power source S3 is used to apply positive voltage to the mask plate 1 when the third switch K3 is switched on and the fourth switch K4 is switched off so that the mask plate 1 electrostatically adsorbs the first substrate 3. At this moment, the third power source S3 applies positive voltage to the pattern structures 121 via the first connection structure 14 such that the whole mask plate 1 is positively charged, and the first substrate 3 is negatively charged through electrostatic induction. The positively charged mask plate 1 and the negatively charged first substrate 3 attract each other, and therefore the mask plate 1 can electrostatically adsorb the first substrate 3. Preferably, the positive voltage applied by the third power source S3 is larger than 0 kV and less than or equal to 2.0 kV.

Figure 5B:
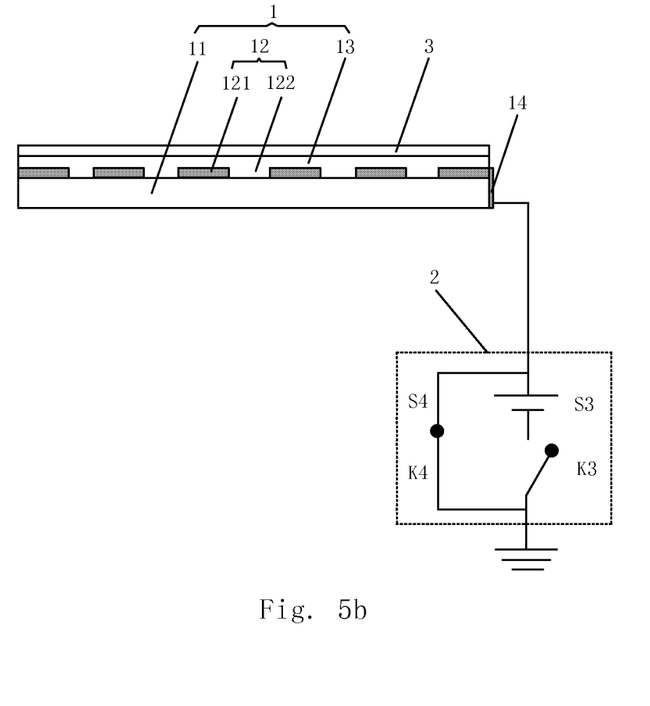
FIG. 5b is a schematic diagram illustrating another operation state of the control circuit in FIG. 4.

FIG. 5b is a schematic diagram illustrating another operation state of the control circuit in FIG. 4. As shown in FIG. 5b, when it is needed to release the first substrate 3 fixed on the mask plate 1, the releasing branch circuit S4 is used to release positive charges from the mask plate 1 so as to release the first substrate 3. Specifically, the releasing branch circuit S4 is used to release positive charges from the mask plate 1 when the fourth switch K4 is switched on and the third switch K3 is switched off so that the mask plate 1 releases the first substrate 3. At this moment, since the releasing branch circuit S4 has released positive charges from the mask plate 1, the first substrate 3 is no longer negatively charged. Therefore, the mask plate 1 and the first substrate 3 do not attract each other so that the mask plate 1 releases the first substrate 3.

In practical applications, optionally, a negative electrode of the third power source and one terminal of the releasing branch circuit are both connected to the mask plate, a positive electrode of the third power source is grounded via the third switch, and the other terminal of the releasing branch circuit is grounded via the fourth switch. When it is needed to fix the first substrate on the mask plate, the third power source is used to apply negative voltage to the mask plate so that the mask plate electrostatically adsorbs the first substrate. Specifically, the third power source is used to apply negative voltage to the mask plate when the third switch is switched on and the fourth switch is switched off so that the mask plate electrostatically adsorbs the first substrate. When it is needed to release the first substrate fixed on the mask plate, the releasing branch circuit is used to release negative charges from the mask plate so as to release the first substrate. Specifically, the releasing branch circuit is used to release negative charges from the mask plate when the fourth switch is switched on and the third switch is switched off. The schematic diagram of the specific structure and the operation states of the control circuit in this situation is not drawn specifically. Preferably, the negative voltage applied by the third power source is larger than or equal to −2.0 kV and less than 0 kV.

For detailed description of the remaining structures in the packaging apparatus of the present embodiment, reference can be made to the above-described first embodiment and the description will not be repeated here.

In the technical solution of the packaging apparatus provided in the present embodiment, the control circuit controls the mask plate such that the mask plate electrostatically adsorbs or releases the first substrate without the need to use the alignment mechanism of mechanical fixing type to fix the first substrate. By completely adsorbing the first substrate by the mask plate in a way of electrostatic adsorption, the deformation of the first substrate and the generation of bubbles between the first substrate and the second substrate are avoided, the alignment precision is improved, and the slip-off of the first substrate from the mask plate during the process of pressing is avoided.

Figure 6:
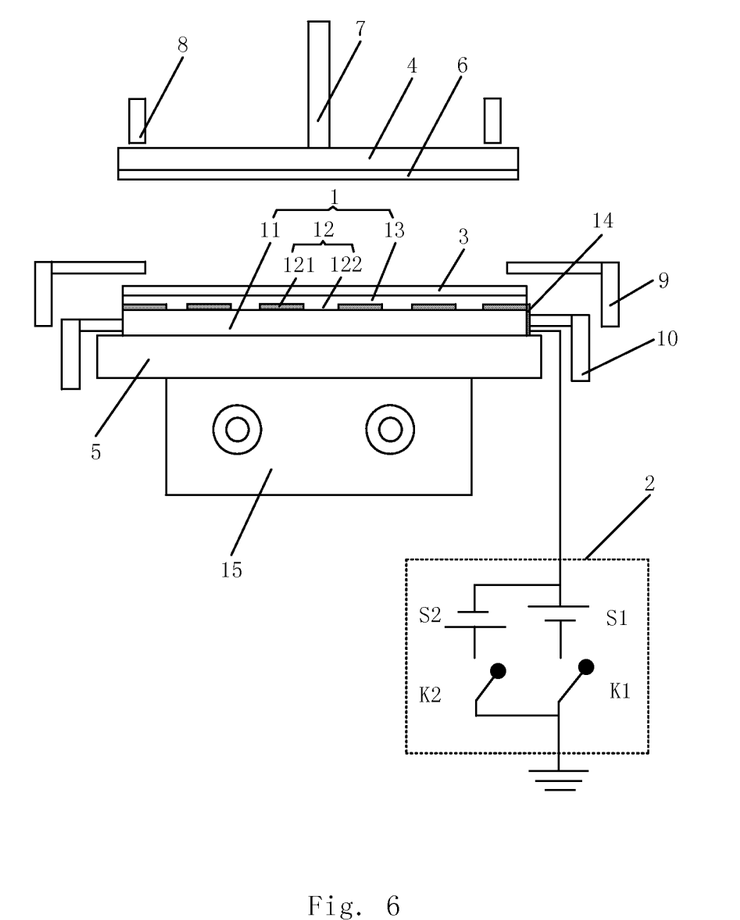
FIG. 6 is a schematic diagram illustrating the structure of a packaging device provided in a third embodiment of the present invention.

FIG. 6 is a schematic diagram illustrating the structure of a packaging device provided in a third embodiment of the present invention. As shown in FIG. 6, the packaging device comprises an upper platform 4, a lower platform 5 and a packaging apparatus. The packaging apparatus can adopt the packaging apparatus provided in the first or second embodiment as described hereinabove, and will not be described repetitively herein. In this packaging device, the mask plate 1 is arranged on the lower platform 5, and the upper platform 4 is used to arrange a second substrate 6.

The packaging device in the present embodiment is used to package the first substrate 3 and the second substrate 6 that are arranged opposed to each other so that the first substrate 3 and the second substrate 6 form a display screen.

Furthermore, the packaging device further comprises an up-and-down mechanism 7 on the upper platform 4 for controlling the upper platform 4 to move up and down.

Furthermore, the packaging device further comprises an alignment camera 8 for aligning the first substrate 3 and the second substrate 6. For example, the alignment camera 8 may be a charge-coupled device (CCD) camera.

Furthermore, the packaging device further comprises a substrate reception gripper 9 for delivering the first substrate 3 onto the lower platform 5 and delivering the second substrate 6 onto the upper platform 4.

Furthermore, the packaging device further comprises a positioning mechanism 10 for fixing the position of the mask plate 1.

Furthermore, the packaging device further comprises a LTV light source 15 under the lower platform 5 which is used to cure the frame-sealing adhesive between the first substrate 3 and the second substrate 6 through the mask plate 1.

Hereinafter the packaging process performed by the packaging device provided in the present embodiment will be described in detail by using a specific example.

The substrate reception gripper 9 grips the second substrate 6 and situates the second substrate 6 thereon; the substrate reception gripper 9 delivers the second substrate 6 onto the upper platform 4 and the upper platform 4 adsorbs the second substrate 6 so as to fix the second substrate 6 on the upper platform 4; the substrate reception gripper 9 descends, grips the first substrate 3 and situates the first substrate 3 thereon; the substrate reception gripper 9 delivers the first substrate 3 onto the mask plate 1; an alignment mechanism (not shown in the figure) aligns the mask plate 1 and the first substrate 3 thereon with the co-operation of the alignment camera 8; after the alignment is achieved, the control circuit 2 controls the mask plate 1 such that the mask plate 1 electrostatically adsorbs the first substrate 3, and at this moment, the first substrate 3 is fixed on the mask plate 1; an evacuating device (not shown in the figure) performs evacuation such that the packaging device is in a vacuum environment; the up-and-down mechanism 7 controls the upper platform 4 to move down such that the second substrate 6 is carried to move down; when the distance between the first substrate 3 and the second substrate 6 is smaller than a certain distance, for example, when the distance between the first substrate 3 and the second substrate 6 is 2 mm, the first substrate 3 and the second substrate 6 are aligned by using the alignment camera 8; the up-and-down mechanism 7 continues to control the upper platform 4 to move down such that the second substrate 6 is carried to move down, and when the first substrate 3 and the second substrate 6 approach a bonding state, gas inflation is perform to the vacuum environment to press the first substrate 3 and the second substrate 6 together; after pressing the first substrate 3 and the second substrate 6 for a while, a UV light source 15 is used to irradiate the frame-sealing adhesive between the first substrate 3 and the second substrate 6 through the mask plate 1 so as to cure the frame-sealing adhesive, and the first substrate 3 and the second substrate 6 forms a display screen after the irradiation is finished; the upper platform 4 desorbs the second substrate 6 and moves a short distance upwards, and then the precision of the display screen is confirmed by the alignment camera 8; the control circuit 2 control the mask plate 1 so that the mask plate 1 releases the first substrate 3 and thereby releases the display screen; the display screen is moved out by a carrying tool (not shown in the figure).

Figure 7A:
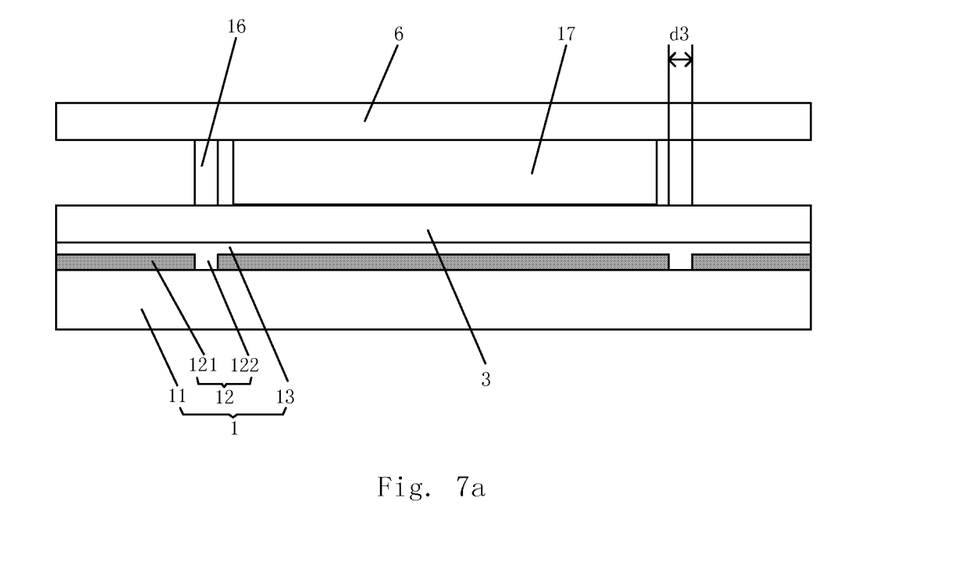
FIG. 7a is a schematic diagram illustrating the curing of a frame-sealing adhesive in a packaging process using the packaging device in FIG. 6.

FIG. 7a is a schematic diagram illustrating the curing of a frame-sealing adhesive in a packaging process using the packaging device in FIG. 6. As illustrated in FIG. 7a, a UV light source (not shown in the figure) irradiates the frame-sealing adhesive 16 between the first substrate 3 and the second substrate 6 through the mask plate 1 during the packaging process. Specifically, the UV light emitted by the UV light source irradiates the frame-sealing adhesive 16 through the opening structures 122. The frame-sealing adhesive is provided in the peripheral region of the display area 17 and has a certain distance to the display area 17. During the packaging process, for the reason that the aligning precision of each of the first substrate 3 and the second substrate 6 is high, the width of the frame-sealing adhesive 16 can be small, for example, the width d3 of the frame-sealing adhesive 16 may be in the range of 0.2 mm to 0.4 mm.

Figure 7B:
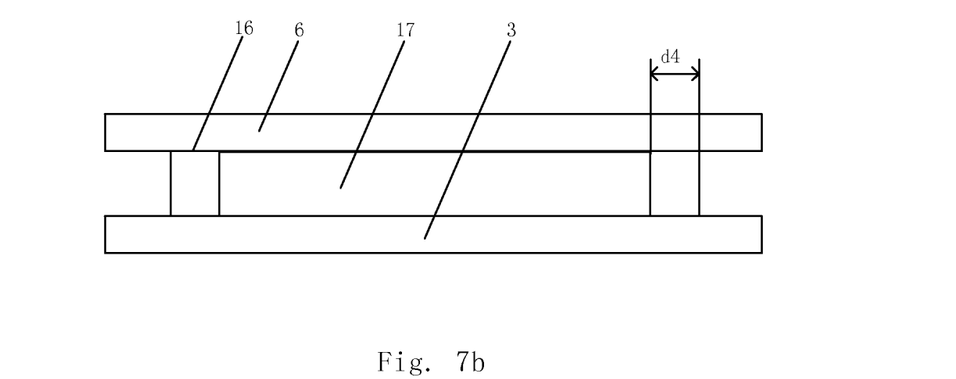
FIG. 7b is a schematic diagram illustrating the frame-sealing adhesive after the packaging using the packaging device in FIG. 6.

FIG. 7b is a schematic diagram illustrating the frame-sealing adhesive after the display screen is formed by performing the packaging using the packaging device in FIG. 6. As shown in FIG. 7b, although the width of the frame-sealing adhesive 16 could be made larger when the first substrate 3 and the second substrate 6 are pressed together during the packaging process, a width d4 of the frame-sealing adhesive 16 after packaging can be maintained in the range of 0.8 mm to 1.0 mm since the width of the frame-sealing adhesive 16 before packaging is very small. By using the packaging device in the present embodiment, a display screen in which the frame-sealing adhesive has a width of 1.0 mm or less can be fabricated, thereby a narrow frame-sealing adhesive and further a display screen with a narrow bezel can be achieved.

After packaging the first substrate and the second substrate by using the packaging device provided in the present embodiment, the precision of the alignment between the first substrate 3 and the second substrate 6 can be less than ±2 μm. Therefore the alignment precision is improved as compared with the prior art. In the present embodiment, the alignment mechanism only aligns the first substrate 3 and thereafter the fixing of the first substrate 3 on the mask plate 1 is achieved by the control circuit 2, and thus it is not needed to use an alignment mechanism to fix the first substrate 3. Therefore, the structure of the alignment mechanism in the present embodiment is simpler than the alignment mechanism of mechanical fixing type in the prior art.

In the present embodiment, the first substrate 3 may be an OLED substrate and the second substrate 6 may be a packaging substrate, or alternatively, the first substrate 3 is the packaging substrate and the second substrate 6 is the OLED substrate.

In practical applications, optionally, the mask plate may be arranged on the upper platform and the lower platform is used to arrange the second substrate, which is not specifically drawn. If the packaging apparatus in FIG. 1 is adopted, it is preferable that the positive voltage applied by the first power source S1 is larger than 0 kV and less than or equal to 6.0 kV, and the negative voltage applied by the second power source S2 is larger or equal to −6.0 kV and less than 0 kV. If the packaging apparatus in FIG. 4 is adopted, it is preferable that the positive voltage applied by the third power source S3 is larger than 0 kV and less than or equal to 6.0 kV. Alternatively, the third power source S3 may apply negative voltage that is larger or equal to −6.0 kV and less than 0 kV, which is not specifically drawn.

In the technical solution of the packaging device provided in the present embodiment, control circuit controls the mask plate such that the mask plate electrostatically adsorbs or releases the first substrate without the need to use the alignment mechanism of mechanical fixing type to fix the first substrate. By making the mask plate completely adsorb the first substrate in a way of electrostatic adsorption, the deformation of the first substrate and the generation of bubbles between the first substrate and the second substrate are avoided, the alignment precision is improved, and the slip-off of the first substrate from the mask plate during the process of pressing is avoided.

It is appreciated that the above embodiments are merely illustrative embodiments employed for illustrating principle of the present invention, and the present invention is not limited thereto. Various variations and improvements may be made by those skilled in the art without departing from the spirit and essence of the present invention, and such variations and improvements are also considered as within the protection scope of the present invention.

The invention claimed is:

1. A packaging apparatus comprising:
   a mask plate including a base substrate, a pattern layer on the base substrate, an insulation layer on the pattern layer, a first connection structure on a lateral side of the base substrate and at least one second connection structure, the pattern layer including pattern structures and opening structures between the pattern structures, the at least one second connection structure being in each of the opening structures; and
   a control circuit that is electrically connected to the mask plate and is used to control the mask plate such that the mask plate electrostatically adsorbs a first substrate or releases the first substrate,
   wherein the pattern structures are electrically connected to the control circuit, wherein the first connection structure is used to electrically connect the pattern structures to the control circuit, and wherein the second connection structure is used to electrically connect a pattern structure outside the opening structures to a pattern structure inside the opening structures.

2. The packaging apparatus according to claim 1, wherein a length of the second connection structure is larger than or equal to a width of the opening structures.

3. The packaging apparatus according to claim 1, wherein a positive voltage is applied to the mask plate through the control circuit such that the mask plate adsorbs the first substrate, and then a negative voltage is applied to the mask plate or positive charges are released from the mask plate through the control circuit such that the mask plate releases the first substrate; or alternatively, a negative voltage is applied to the mask plate through the control circuit such that the mask plate adsorbs the first substrate, and then a positive voltage is applied to the mask plate or negative charges are released from the mask plate through the control circuit such that the mask plate releases the first substrate.

4. The packaging apparatus according to claim 3, wherein the control circuit comprises a first power source and a second power source that are connected in parallel, wherein the first power source is used to apply the positive voltage to the mask plate and wherein the second power source is used to apply the negative voltage to the mask plate.

5. The packaging apparatus according to claim 4,
wherein a positive electrode of the first power source and a negative electrode of the second power source are both connected to the mask plate, a negative electrode of the first power source is grounded via a first switch, and a positive electrode of the second power source is grounded via a second switch, and wherein the first power source is used to apply the positive voltage to the mask plate when the first switch is switched on and the second switch is switched off, and the second power source is used to apply the negative voltage to the mask plate when the second switch is switched on and the first switch is switched off.

6. The packaging apparatus according to claim 3, wherein the control circuit comprises a third power source and a releasing branch circuit that are connected in parallel, wherein:

the third power source is used to apply the positive voltage to the mask plate and the releasing branch circuit is used to release the positive charges from the mask plate, or alternatively, the third power source is used to apply the negative voltage to the mask plate and the releasing branch circuit is used to release the negative charges from the mask plate.

7. The packaging apparatus according to claim 6, wherein in the case that the third power source is used to apply the positive voltage to the mask plate and the releasing branch circuit is used to release the positive charges from the mask plate, a positive electrode of the third power source and one terminal of the releasing branch circuit are both connected to the mask plate, a negative electrode of the third power source is grounded via a third switch, and the other terminal of the releasing branch circuit is grounded via a fourth switch, wherein the third power source is used to apply the positive voltage to the mask plate when the third switch is switched on and the fourth switch is switched off, and wherein the releasing branch circuit is used to release the positive charges from the mask plate when the fourth switch is switched on and the third switch is switched off.

8. The packaging apparatus according to claim 6, wherein in the case that the third power source is used to apply the negative voltage to the mask plate and the releasing branch circuit is used to release the negative charges from the mask plate, a negative electrode of the third power source and one terminal of the releasing branch circuit are both connected to the mask plate, a positive electrode of the third power source is grounded via a third switch, and the other terminal of the releasing branch circuit is grounded via a fourth switch, wherein the third power source is used to apply the negative voltage to the mask plate when the third switch is switched on and the fourth switch is switched off, and wherein the releasing branch circuit is used to release the negative charges from the mask plate when the fourth switch is switched on and the third switch is switched off.

9. A packaging device comprising an upper platform, a lower platform and the packaging apparatus according to claim 1, wherein:

the mask plate is arranged on the lower platform, and the upper platform is used to arrange a second substrate; or alternatively, the mask plate is arranged on the upper platform, and the lower platform is used to arrange the second substrate.

10. A packaging device comprising an upper platform, a lower platform and the packaging apparatus according to claim 2, wherein:

the mask plate is arranged on the lower platform, and the upper platform is used to arrange a second substrate; or alternatively, the mask plate is arranged on the upper platform, and the lower platform is used to arrange the second substrate.

11. A packaging device comprising an upper platform, a lower platform and the packaging apparatus according to claim 3, wherein:

the mask plate is arranged on the lower platform, and the upper platform is used to arrange a second substrate; or alternatively, the mask plate is arranged on the upper platform, and the lower platform is used to arrange the second substrate.

12. A packaging device comprising an upper platform, a lower platform and the packaging apparatus according to claim 4, wherein:

the mask plate is arranged on the lower platform, and the upper platform is used to arrange a second substrate; or alternatively, the mask plate is arranged on the upper platform, and the lower platform is used to arrange the second substrate.

13. A packaging device comprising an upper platform, a lower platform and the packaging apparatus according to claim 5, wherein:

the mask plate is arranged on the lower platform, and the upper platform is used to arrange a second substrate; or alternatively, the mask plate is arranged on the upper platform, and the lower platform is used to arrange the second substrate.

14. A packaging device comprising an upper platform, a lower platform and the packaging apparatus according to claim 6, wherein:

the mask plate is arranged on the lower platform, and the upper platform is used to arrange a second substrate; or alternatively, the mask plate is arranged on the upper platform, and the lower platform is used to arrange the second substrate.

15. A packaging device comprising an upper platform, a lower platform and the packaging apparatus according to claim 7, wherein:

the mask plate is arranged on the lower platform, and the upper platform is used to arrange a second substrate; or alternatively, the mask plate is arranged on the upper platform, and the lower platform is used to arrange the second substrate.

16. A packaging device comprising an upper platform, a lower platform and the packaging apparatus according to claim 8, wherein:

the mask plate is arranged on the lower platform, and the upper platform is used to arrange a second substrate; or alternatively, the mask plate is arranged on the upper platform, and the lower platform is used to arrange the second substrate.

* * * * *

UNITED STATES PATENT AND TRADEMARK OFFICE
CERTIFICATE OF CORRECTION

PATENT NO. : 10,026,635 B2
APPLICATION NO. : 14/891880
DATED : July 17, 2018
INVENTOR(S) : Seiji Fujino, Guodong Huang and Xiaolei Zhang It is certified that error appears in the above-identified patent and that said Letters Patent is hereby corrected as shown below:

In the Specification

At Column 4, Line 35, please replace "LTV" with "UV";

At Column 5, Line 10, please replace "dl" with "d1"; and

At Column 8, Line 23, please replace "LTV" with "UV".

Signed and Sealed this
Fourth Day of December, 2018

Andrei Iancu
*Director of the United States Patent and Trademark Office*